United States Patent
Wu et al.

(10) Patent No.: US 12,026,385 B2
(45) Date of Patent: *Jul. 2, 2024

(54) AUTOMATIC WORDLINE STATUS BYPASS MANAGEMENT

(71) Applicant: Micron Technology, Inc., Boise, ID (US)

(72) Inventors: Jiangang Wu, Milpitas, CA (US); Jung Sheng Hoei, Newark, CA (US); Qisong Lin, El Dorado Hills, CA (US); Kishore Kumar Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/952,927

(22) Filed: Sep. 26, 2022

(65) Prior Publication Data

US 2023/0019189 A1 Jan. 19, 2023

Related U.S. Application Data

(63) Continuation of application No. 17/160,144, filed on Jan. 27, 2021, now Pat. No. 11,455,109.

(51) Int. Cl.
*G06F 3/06* (2006.01)
(52) U.S. Cl.
CPC ............ *G06F 3/064* (2013.01); *G06F 3/0604* (2013.01); *G06F 3/0673* (2013.01)
(58) Field of Classification Search
None
See application file for complete search history.

(56) References Cited

U.S. PATENT DOCUMENTS

| | | | |
|---|---|---|---|
| 9,978,456 B2 | 5/2018 | Khandelwal et al. | |
| 10,199,111 B1 * | 2/2019 | Besinga | G11C 16/28 |

(Continued)

FOREIGN PATENT DOCUMENTS

| | | |
|---|---|---|
| CN | 110431526 | 11/2019 |
| CN | 111566610 | 8/2020 |
| CN | 114817095 | 7/2022 |

OTHER PUBLICATIONS

"Chinese Application Serial No. 202210101422.2, Office Action dated Jan. 12, 2023", with machine English translation, 12 pages.

(Continued)

*Primary Examiner* — Brian R Peugh
(74) *Attorney, Agent, or Firm* — Schwegman Lundberg & Woessner, P.A.

(57) ABSTRACT

A processing device access a command to program data to a page in a block of a memory device. The processing device determines whether the page is a last remaining open page in the block. The processing device accesses a list that indicates enablement of a function to apply read level offsets to one or more open blocks in the memory device. The processing device determines the list includes an entry that matches to the block. The entry indicates enablement of the function to apply read level offsets to the block. The processing device disables the function based on determining the page is a last remaining open page in the block. The processing device adds the command to a prioritized queue of commands. The memory device executes commands from the prioritized queue in an order based on a priority level assigned to each command.

20 Claims, 6 Drawing Sheets

(56) References Cited

U.S. PATENT DOCUMENTS

| | | |
|---|---|---|
| 2018/0059971 A1 | 3/2018 | Jung et al. |
| 2018/0301193 A1 | 10/2018 | Srinivasan et al. |
| 2019/0107961 A1 | 4/2019 | Lee |
| 2019/0171360 A1 | 6/2019 | Lee et al. |
| 2020/0027503 A1 | 1/2020 | Chen et al. |
| 2022/0236871 A1 | 7/2022 | Wu et al. |

OTHER PUBLICATIONS

U.S. Appl. No. 17/160,144 U.S. Pat. No. 11,455,109, filed Jan. 27, 2021, Automatic Wordline Status Bypass Management.

* cited by examiner

AUTOMATIC WORDLINE STATUS BYPASS MANAGEMENT

PRIORITY APPLICATION

This application is a continuation of U.S. application Ser. No. 17/160,144, filed Jan. 27, 2021, now U.S. Pat. No. 11,455,109, which is incorporated herein by reference in its entirety.

TECHNICAL FIELD

Embodiments of the disclosure relate generally to memory sub-systems and, more specifically, to management of automatic wordline status bypass functionality.

BACKGROUND

A memory sub-system can include one or more memory devices that store data. The memory components can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various example embodiments of the disclosure.

DETAILED DESCRIPTION

Figure 1:
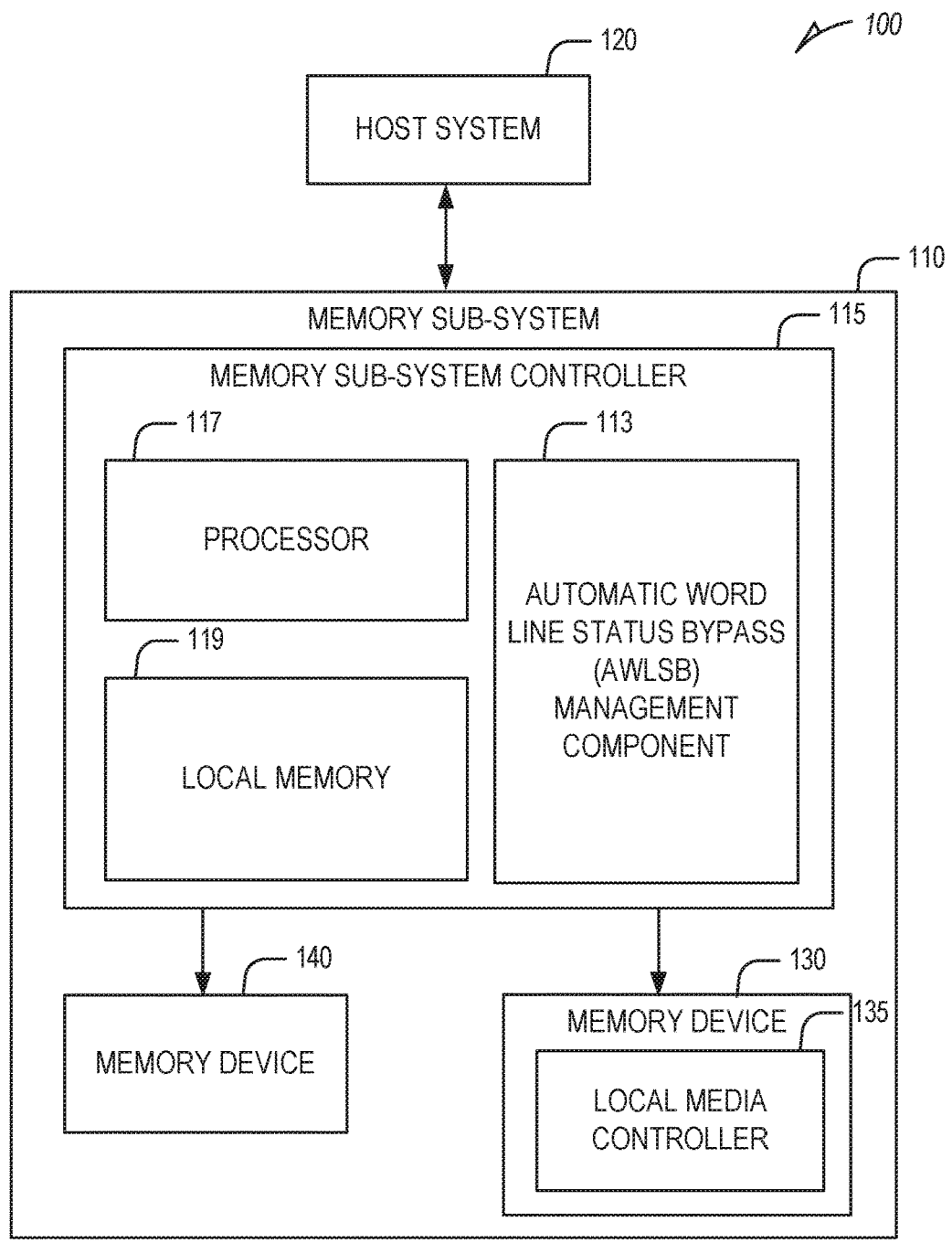
FIG. 1 illustrates an example computing system that includes a memory sub-system, in accordance with some embodiments of the present disclosure.

Aspects of the present disclosure are directed to read-disturb management techniques that include management of automatic wordline status bypass functionality in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of a non-volatile memory device is a negative-and (NAND) memory device. Other examples of non-volatile memory devices are described below in conjunction with FIG. 1. Some memory devices, such as NAND memory devices, include an array of memory cells (e.g., flash cells) to store data. Each cell includes a transistor, and within each cell, data is stored as the threshold voltage of the transistor, based on the logical value of the cell (e.g., 0 or 1). Memory cells in these devices can be grouped as pages that can refer to a logical unit of the memory device used to store data. For example, memory cells in NAND memory devices are connected horizontally at their control gates to a word line to form a page. With some types of memory devices (e.g., NAND), pages are grouped to form blocks (also referred to herein as "memory blocks").

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system.

When data has been programmed on only a portion of a block within a memory device, the block can be referred to as a "partially programmed block" or simply as a "partial block" or "open block." Similarly, a page within a partial block that is not fully programmed can be referred to as an "open page." This is in contrast to a block or a page that has been programmed completely with data, which are respectively referred to as a "fully programmed block" and "fully programmed page" or simply as a "closed block" or "closed page."

During a read operation in a NAND device, read reference voltages are applied to cells (e.g., to the control gate of the transistors), and used to determine whether the cells are programmed or erased, and if a cell is programmed the stored value is determined based on threshold voltage of the cell. The voltage position of an applied read reference voltage is referred to as "read level." In multi-level cell (MLC) NAND devices in which a single cell is capable of storing more than a single bit, different read levels are used to read the different values each cell is capable of storing. During a read operation on a partial block, word lines can become decoupled, which can lead to lowered voltage levels being read from cells in the word line thereby reducing the reliability with which the underlying data can be read. To address this issue, memory sub-systems often apply read level offsets to improve read sensing time on a partial block. An AWLSB function can be used by the memory sub-system to apply the read level offsets to improve the read sensing time on a partial block, thereby allowing the stored data to be reliably read. Once the block is fully programmed, the AWLSB function must be disabled to remove the read level offsets; otherwise data stored by the block cannot be reliably retrieved as attempts to read data programmed into the block return uncorrectable error correction code (UECC) or empty pages.

Memory sub-systems often include multiple hardware queues to facilitate processing of the potentially numerous data operation requests that may be received from the host system. Each queue can have one or more priority levels that are used to determine an order in which operations are performed. The priority level associated with a given request is typically based on the request type (e.g., read, program, erase). For example, a first priority level can be assigned to a read operation, a second priority level can be assigned to a program operation, and a third priority level can be assigned to an erase operation. In this example, the first priority level is a higher priority than the second priority level, and the second priority level is a higher priority than the third priority level. In accordance with this example, read operations are prioritized over both program and erase operations, and program operations are prioritized over erase operations.

Once the memory sub-system adds data operations commands to these queues, the memory device is responsible for scheduling queued requests based on priority levels. However, because of the varied priority levels among requests, the order that the memory device performs the queued operations can be different than the order expected by the memory sub-system, which can result in numerous race conditions and other problems with recovering stored data. For example, a read command directed at a partial block can be added to a queue along with commands to enable and later disable an AWLSB function associated with the partial block. However, one or more program commands directed at the partial block may also be queued, and because of the varied priority levels assigned to the commands, the memory device may execute the read operation after the block has been fully programmed, but before the AWLSB function is disabled, thereby resulting in an empty page being returned as a response to the read command.

Aspects of the present disclosure address issues with conventional handling in prioritized queues in memory sub-systems by ensuring a proper command execution order for command sequences that include commands to read and program data to/from a partial block. That is, aspects of the present disclosure present systems and methods for managing AWLSB functions to ensure that commands to read data from partial blocks (including commands to enable or disable AWLSB functions) follow behind program commands in command execution sequences. To ensure this execution order, existing AWLSB entries are removed when the last page of a block is fully programmed. By ensuring a proper execution order of command sequences, race conditions that can arise in executing read operations on partially programmed blocks in memory systems with prioritized queuing are eliminated while still providing the benefit of increased performance and read sensing time achieved through applying read level offsets via AWLSB functions.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can be coupled to the memory sub-system 110 via a host interface. Examples of a host interface include, but are not limited to, a SATA interface, a PCIe interface, USB interface, Fibre Channel, Serial Attached SCSI (SAS), Small Computer System Interface (SCSI), a double data rate (DDR) memory bus, a DIMM interface (e.g., DIMM socket interface that supports Double Data Rate (DDR)), Open NAND Flash Interface (ONFI), Double Data Rate (DDR), Low Power Double Data Rate (LPDDR), or any other interface. The host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include NAND type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and 3D NAND.

Each of the memory devices 130 can include one or more arrays of memory cells. One type of memory cell, for example, single level cells (SLC), can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. For example, memory cells in NAND memory devices are connected horizontally at their control gates to a word line to form a page. With some types of memory (e.g., NAND), pages can be grouped to form blocks. Additionally, word lines within a memory device can be organized into multiple word line groups, each of which includes one or more word lines, though each word line group includes fewer word lines than are included in a block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOR flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application-specific integrated circuit (ASIC), etc.), or other suitable processor.

The memory sub-system controller 115 can include a processor 117 (processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and the like. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and ECC operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 and convert responses associated with the memory devices 130 and/or the memory device 140 into information for the host system 120.

In some embodiments, the memory devices 130 include local media controller 135 that operates in conjunction with memory sub-system controller 115 to execute operations on one or more memory cells of the memory devices 130.

The memory sub-system 110 also includes AWLSB management component 113 that is responsible for managing AWLSB functionality within the memory sub-system 110. Accordingly, the AWLSB management component 113 is responsible for enabling and disabling AWLSB functions with respect to the memory devices 130 and 140 to apply or remove read level offsets to partial blocks to ensure data can be read reliably. More specifically, the AWLSB management component 113 ensures that read level offsets are applied when executing read operations at a partial block in one of the memory devices 130 or 140. In addition, the AWLSB management component 113 ensures that the read level offsets are removed once a block becomes fully programed.

As will be discussed in further detail below, the memory sub-system controller 115 can utilize a prioritized queue to execute data operations commands, which can introduce race conditions due to the varied priority level assigned to queue commands. The AWLSB management component 113 monitors data operation commands to eliminate race conditions that can occur when read level offsets are applied to a partial block that later becomes fully programmed. Further details regarding the management of the AWLSB functionality by the AWLSB management component 113 within the memory sub-system 110 are discussed below in reference to FIGS. 2-5.

In some embodiments, the memory sub-system controller 115 includes at least a portion of the AWLSB management component 113. For example, the memory sub-system controller 115 can include a processor 117 (processing device) configured to execute instructions stored in local memory 119 for performing the operations described herein. In some embodiments, the AWLSB management component 113 is part of the host system 120, an application, or an operating system. In some embodiments, the local media controller 135 includes at least a portion of the AWLSB management component 113.

Figure 2:
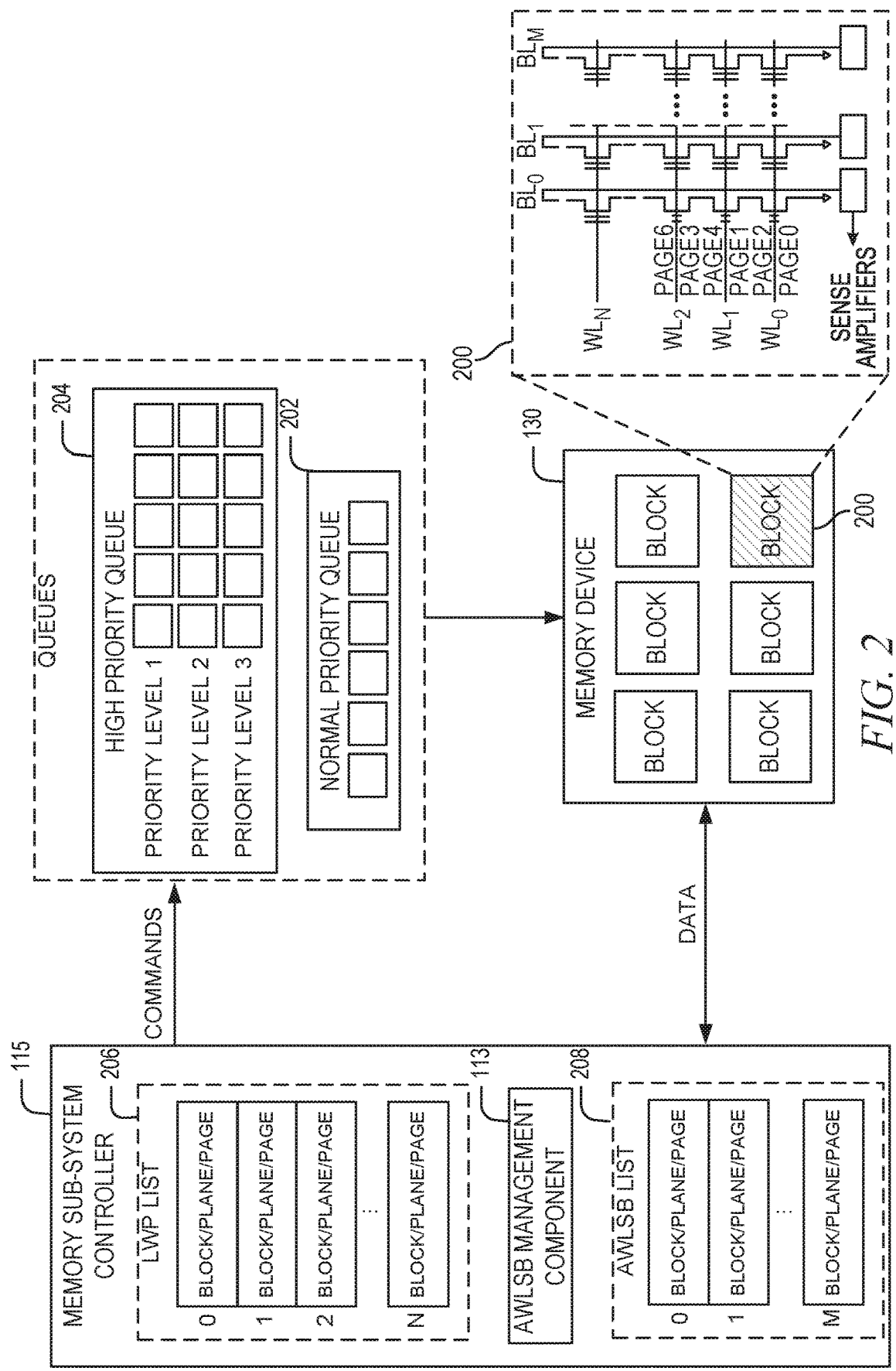
FIG. 2 illustrates interactions between components of the memory sub-system in managing automatic word line status bypass (AWLSB) functions, in accordance with some embodiments of the present disclosure.

FIG. 2 illustrates interactions between components of the memory sub-system in managing AWLSB functions, in accordance with some embodiments of the present disclosure. In the example illustrated in FIG. 2, the memory device 130 is a NAND memory device including multiple memory blocks.

As shown, a NAND block 200 includes an array (2D or 3D) of pages (rows) and strings (columns). Each NAND cell includes a transistor, and within each cell, data is stored as the threshold voltage of the transistor, based on the logical value of the cell (e.g., 0 or 1). Strings are connected within the NAND block 200 to allow storage and retrieval of data from selected cells. NAND cells in the same column are connected in series to form a bit line (BL). All cells in a bit line are connected to a common ground on one end and a common sense amplifier on the other for reading the threshold voltage of one of the cells when decoding data. NAND cells are connected horizontally at their control gates to a word line (WL) to form a page. A page is a set of connected cells that share the same word line and is the minimum unit to program.

As noted above, the memory sub-system controller 115 can receive commands or operations from the host system 120 and can convert the commands or operations into appropriate commands to achieve the desired access to the memory device 130. The memory sub-system controller 115 uses multiple hardware queues to facilitate execution of the commands at the memory device 130. For example, in the example illustrated in FIG. 2., the memory sub-system controller 115 uses a normal priority queue 202 and a high priority queue 204. The high priority queue 204 includes multiple priority levels that are used to determine an order in which queued operations are performed at the memory device 130. The priority level associated with a given request is based on the request type (e.g., read, program, erase). For example, a first priority level can be assigned to a read operation, a second priority level can be assigned to a program operation, and a third priority level can be assigned to an erase operation. In this example, the first priority level is a higher priority than the second priority level, and the second priority level is a higher priority than the third priority level.

The memory sub-system controller 115 also maintains a last written page (LWP) list 206 to track the LWP in each partial block of the memory device 130. The LWP refers to the page in a given block that was most recently programmed with data and thus, the LWP list 206 includes an entry for each partial block in the memory device 130 that identifies the most recently programmed page in the corresponding block. An LWP can be identified using a Logical Unit Number (LUN) or other such identifier that can uniquely identify a page in the memory device 130.

During a read operation on a partial block, word lines can become decoupled, which can prevent the underlying data from being reliably read. To address this issue, the AWLSB management component 113 causes read level offsets to be applied to pages in the partial block to improve read sensing time. As referenced above, the memory sub-system controller 115 uses an AWLSB function to effectuate the application of the read level offsets. To enable the AWLSB function with respect to a particular LUN, the AWLSB management component 113 adds an entry to an AWLSB list 208. Hence, each entry in the AWLSB list 208 indicates enablement of the AWLSB function to apply read level offsets to the corresponding LUN.

Once the block is fully programmed, data stored by the block cannot be reliably retrieved if the AWLSB function is still enabled. To disable the AWLSB function with respect to a particular LUN, the AWLSB management component 113 removes or replaces the entry on the AWLSB list 208.

The memory device 130 is responsible for scheduling queued commands based on queue priority and priority levels within queues. Because of the varied priority levels applied to the queued commands, the order that the memory device executes the commands can be different than the order expected by the memory sub-system controller 115 resulting in numerous race conditions. In an example, the block 200 begins as a partial block. A first read command directed at the last page of the block 200 can be added to the high priority queue 204 along with a command to enable application of read level offsets to the last page of the block 200 (e.g., a command to enable an AWLSB function associated with the partial block). A program command to fully program the block 200 can also be queued along with a command to disable application of read level offsets to the last page of the block 200 because the block will be fully programmed. A second read command directed at the block 200 can be subsequently added to the high priority queue 204. Because the second read command is assigned a higher priority than the command to disable the application of read level offsets to the last page of the block 200, the memory device 130 executes the second read operation after the block 200 has been fully programmed, but before read level offsets are disabled, thereby resulting in an empty page being returned as a response to the second read command.

To avoid these race conditions, the AWLSB management component 113 monitors data operation requests received from the host system to ensure that read commands are not executed on pages of the memory device 130 on which read level offsets are enabled. In doing so, the AWLSB management component 113 updates the AWLSB list 208 as needed to remove existing entries for fully programmed blocks. The AWLSB management component 113 also works to synchronize the LWP list 206 and the AWLSB list 208. Further details regarding the elimination of race conditions in managing AWLSB functionality for a memory sub-system with prioritized queues are discussed below in reference to FIGS. 3-6.

Figure 3:
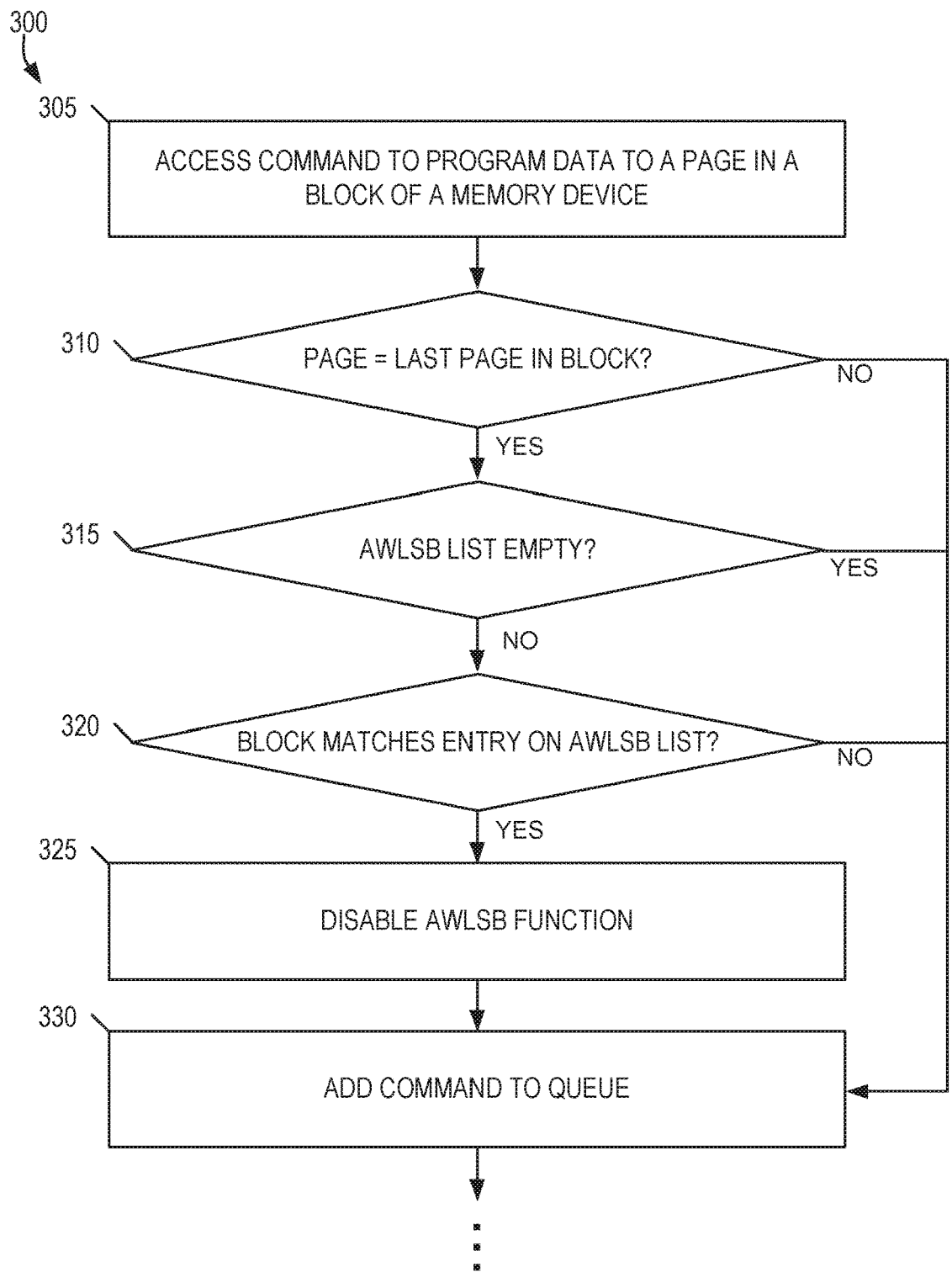
FIGS. 3 and 4 are flow diagrams illustrating an example method for AWLSB management in handling program commands in a memory sub-system, in accordance with some embodiments of the present disclosure.
Figure 4:
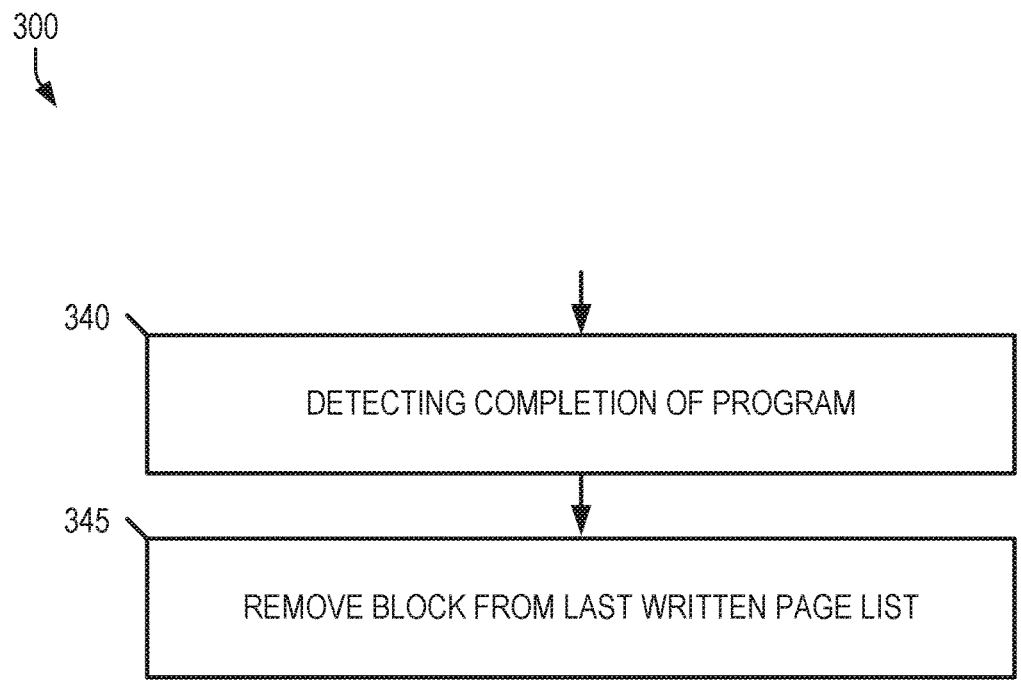

FIGS. 3 and 4 are flow diagrams illustrating an example method 300 for AWLSB management in handling program commands in a memory sub-system, in accordance with some embodiments of the present disclosure. The method 300 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 300 is performed by the AWLSB management component 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device accesses a command to program data to a page in a block of a memory device (e.g., the memory device 130). The command can correspond to or be based on a request to program data to the memory device received from a host system. The page to which the data is to be programmed can be based on a location specified by a write pointer. That is, the data is to be written to the current page of the current block of the write pointer.

At operation 310, the processing device determines the page (e.g., the current page corresponding to a write pointer) is the last page in the block. That is, the processing device determines the page is the last remaining open page in the block and that all other pages in the block are fully programmed.

The process device accesses an AWLSB list (e.g., AWLSB list 208) used to track which open pages in the memory device have an AWLSB function enabled. That is, entries in the AWLSB list identify open pages for which the AWLSB function has been enabled to apply read level offsets to the corresponding open block. At operation 315, the processing device determines whether the AWLSB list is empty. If the processing device determines the AWLSB list is empty, the method 300 proceeds to operation 330.

If the processing device determines the AWLSB list includes at least one entry, the method proceeds to operation 320 where the processing device determines whether an entry on the AWLSB list matches the block. That is, the processing device determines whether the AWLSB includes an entry that matches the block. For example, the processing device can compare an identifier of the block (e.g., a LUN) with identifiers (e.g., LUNs) included in the AWLSB list to identify a match.

At operation 325, the processing device disables an AWLSB function associated with the page. To disable the AWLSB function associated with the page, the processing device removes the matching entry from the AWLSB list and provides a command to the memory device to disable the AWLSB function with respect to the current page. The memory device can maintain a local version of the AWLSB list or can otherwise utilize one or more registers to track and indicate whether an AWLSB function for a particular page.

At operation 330, the processing device adds the program command to a prioritized queue (e.g., high priority queue 204). In adding the program command to the prioritized queue, the processing device sets a priority level of the program command to a first priority level. The first priority level is commonly assigned to program commands and the first priority level is a lower priority level than a second priority level that is assigned to read commands.

Once the command is added to the prioritized queue, the memory device is responsible for executing the command along with any other commands in the queue in an order determined based on a combination of priority level and the order in which the commands where added to the queue.

As shown in FIG. 4, the method 300 can, in some embodiments, include operations 340 and 345. At operation 340, the processing device detects completion of the data programming operation at the memory device. As discussed above, within the context of a memory sub-system, a last written page list (e.g., the LWP list 206) is maintained to track the most recently programmed page in each open block. In response to detecting completion of the programming operation, the processing device removes the block from the last written page list, at operation 345.

Figure 5:
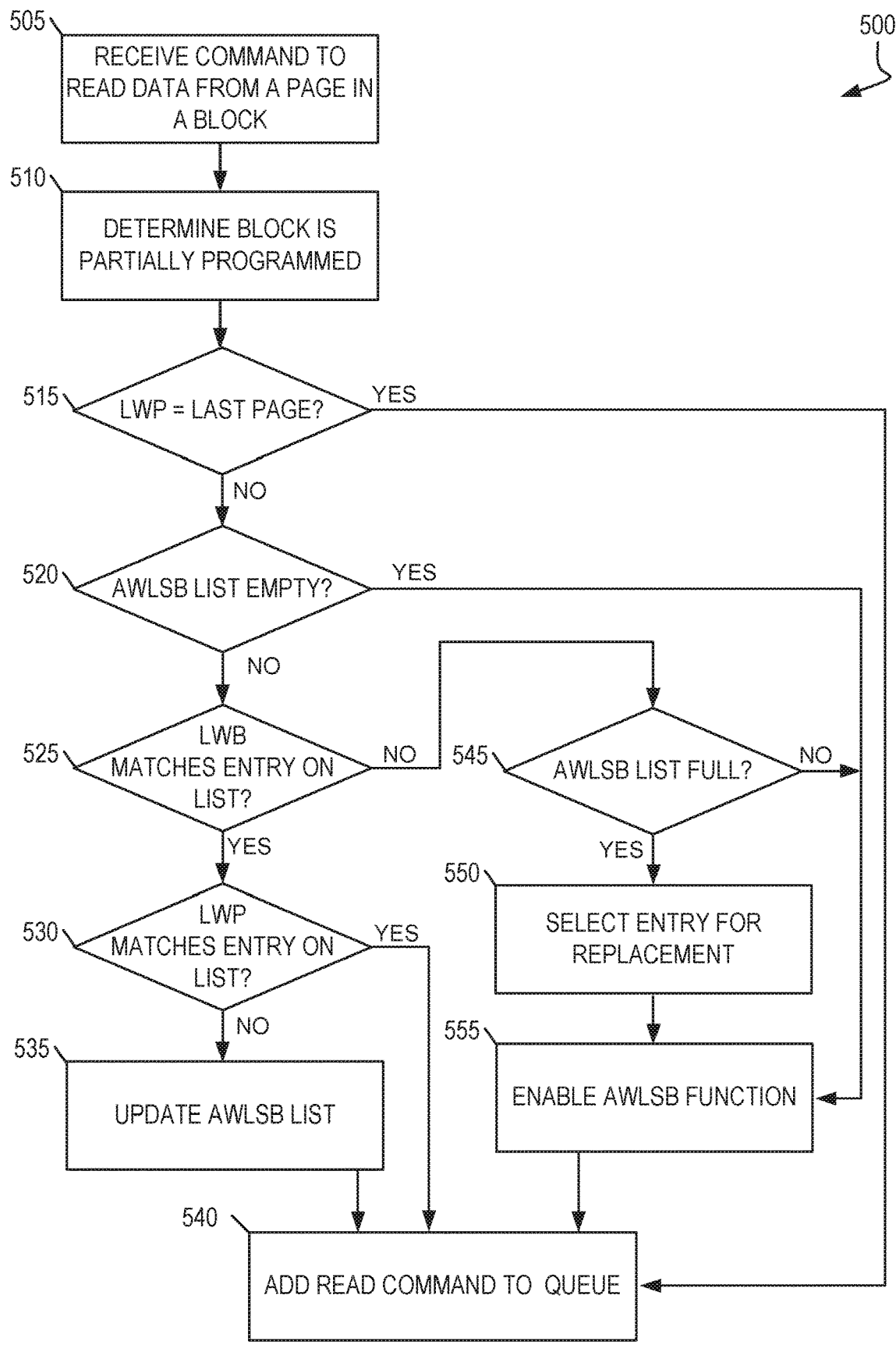
FIG. 5 is a flow diagram illustrating an example method for AWLSB management in handling read commands in a memory sub-system, in accordance with some embodiments of the present disclosure.

FIG. 5 is a flow diagram illustrating an example method 500 for AWLSB management in handling read commands in a memory sub-system, in accordance with some embodiments of the present disclosure. The method 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 500 is performed by the AWLSB management component 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing device accesses a command to read data from a page in a block of a memory device (e.g., the memory device 130). The command can correspond to or be based on a request to program data to the memory device received from a host system (e.g., the host system 120). At operation 510, the processing device determines the block is a partial block. That is, the processing device determines that the block is only partially programmed and not fully programmed.

The processing identifies an LWP in the block, and the processing device determines, at operation 515, whether the LWP in the block is the last page in the block. That is, the processing device determines whether the LWP is the only remaining open page in the block that has not been fully programmed. The processing device maintains an LWP list (e.g., LWP list 206) to track the most recently programmed page in each partial block of the memory device. Accordingly, the processing device identifies the LWP for the block by accessing the LWP list and identifying the entry in the list corresponding to the block.

If the processing device determines the LWP is the last page in the block, the method 500 proceeds to operation 540 where the processing device adds the read command to the high priority queue without further processing. If the processing device determines the LWP is not the last page in the block, the processing device accesses an AWLSB list and determines whether AWLSB list is empty, at operation 520.

If the processing device determines the AWLSB list is empty, the method proceeds to operation 555 where the processing device enables an AWLSB function with respect to the current page. If the processing device determines the AWLSB list includes at least one entry, the method 500 proceeds to operation 525 where the processing device determines whether a LWB matches an entry in the AWLSB list. That is, the processing device determines whether the AWLSB list includes an entry that matches the LWB. For example, the processing device can compare an identifier of the LWB (e.g., a LUN) with identifiers (e.g., LUNs) included in the AWLSB list to determine whether any entries match the block.

If the processing device determines the AWLSB list does not include an entry that matches the last written block, the method 500 proceeds to operation 545 where the processing device determines whether the AWLSB list is full. If the processing device determines the AWLSB list is full, the processing device identifies an entry in the AWLSB list for replacement at operation 550 before enabling an AWLSB function associated with the page, at operation 555. If the list is not full, the processing device proceeds directly to operation 555. To enable the AWLSB function associated with the block, the processing device adds or updates an entry in the AWLSB list and sends a command to the memory device to enable the AWLSB function with respect to the current page. In instances in which the list is not full, the processing device adds an entry to the list to enable the AWLSB function for the page. The entry includes an identifier of the page such as a LUN. In instances in which the list is full, the processing device replaces the selected entry with an updated entry that identifies the current page.

If the processing device determines the AWLSB list includes an entry that matches the LWB, the method proceeds to operation 530, where the processing device determines whether an entry in the AWLSB list matches the LWP. If the processing device identifies an entry in the AWLSB list that matches the LWP, the processing device proceeds to add the read command to the high priority queue at operation 540.

If the processing device determines the AWLSB list does not include an entry that matches the LWP, the processing device updates the AWLSB list, at operation 535. For example, the processing device can update the entry matching the LWB to indicate an update LWP based on the current LWP.

At operation 540, the processing device adds the read command to a prioritized queue (e.g., high priority queue 204). In adding the read command to the prioritized queue, the processing device sets a priority level of the program command to a first priority level. The first priority level is commonly assigned to program commands and the first priority level is a lower priority level than a second priority level that is typically assigned to read commands.

Once the command is added to the prioritized queue, the memory device is responsible for executing the command along with any other commands in the queue in an order determined based on a combination of priority level and the order in which the commands where added to the queue.

Described implementations of the subject matter can include one or more features, alone or in combination.

Example 1 is a memory sub-system comprising: a memory device; and a processing device, operatively coupled with the memory device, to perform operations comprising: access a command to program data to a page in a block of the memory device; determining whether the page is a last remaining open page in the block; accessing a list comprising one or more entries, each of the one or more entries indicating enablement of a function to apply read level offsets to an open block in the memory device; determining the list includes an entry that matches the block, the entry indicating enablement of the function to apply read level offsets to the block; disabling the function to apply the read level offsets to the block based on determining the page is the last remaining open page in the block; and adding the command to a prioritized queue of commands, the memory device to execute commands from the prioritized queue in an order based on a priority level assigned to each command.

Example 2 includes the system of example 1, wherein the operations further comprise: removing the block from a last written page list based on completion of a program operation executed in response to the command, the last written page list identifying a most recently programmed page in each open block of the memory device.

Example 3 includes the system of any one or more of examples 1 or 2, wherein the adding of the command to the prioritized queue comprises assigning a priority level to the command.

Example 4 includes the system of any one or more of examples 1-3, wherein assigning the priority level to the command comprises assigning a first priority level to the command, the first priority level being associated with one or more program commands included in the prioritized queue.

Example 5 includes the system of any one or more of examples 1-4, wherein disabling the function comprises: removing the entry that matches from the list; and providing a command to the memory device to disable the function with respect to the block.

Example 6 is a method comprising: accessing, by a processing device, a command to program data to a page in a block of a memory device; determining, by the processing device, whether the page is a last remaining open page in the block; accessing, by the processing device, a list comprising one or more entries, each of the one or more entries indicating enablement of a function to apply read level offsets to an open block in the memory device; determining, by the processing device, the list includes an entry that matches the block, the entry indicating enablement of the function to apply read level offsets to the block; disabling, by the processing device, the function to apply the read level offsets to the block based on determining the page is the last remaining open page in the block; and adding, by the processing device, the command to a prioritized queue of commands, the memory device to execute commands from the prioritized queue in an order based on a priority level assigned to each command.

Example 7 includes the method of example 6, further comprising: removing the block from a last written page list based on completion of a program operation executed in response to the command, the last written page list identifying a most recently programmed page in each open block of the memory device.

Example 8 includes the method of any one or more of examples 6 or 7, wherein the adding of the command to the prioritized queue comprises assigning a priority level to the command.

Example 9 includes the method of any one or more of examples 6-8, wherein assigning the priority level to the command comprises assigning a first priority level to the command, the first priority level being associated with one or more program commands included in the prioritized queue.

Example 10 includes the method of any one or more of examples 6-10, wherein disabling the function comprises: removing the entry that matches from the list; and providing a command to the memory device to disable the function with respect to the block.

Example 11 is a computer-readable storage medium comprising instructions that, when executed by a processing device, configure the processing device to perform operations comprising: access a command to program data to a page in a block of a memory device; determining whether the page is a last remaining open page in the block; accessing a list comprising one or more entries, each of the one or more entries indicating enablement of a function to apply read level offsets to an open block in the memory device; determining the list includes an entry that to the block, the entry indicating enablement of the function to apply read level offsets to the block; disabling the function to apply the read level offsets to the block based on determining the page is the last remaining open page in the block; and adding the command to a prioritized queue of commands, the memory device to execute commands from the prioritized queue in an order based on a priority level assigned to each command.

Example 12 includes the computer-readable storage medium of example 11, further comprising: removing the block from a last written page list based on completion of a program operation executed in response to the command, the last written page list identifying a most recently programmed page in each open block of the memory device.

Example 13 includes the computer-readable storage medium of any one of examples 11 and 12, wherein the adding of the command to the prioritized queue comprises assigning a priority level to the command.

Example 14 includes the computer-readable storage medium of any one of examples 11-13, wherein assigning the priority level to the command comprises assigning a first priority level to the command, the first priority level being associated with one or more program commands included in the prioritized queue.

Example 15 includes the computer-readable storage medium of any one of examples 11-14, wherein disabling the function comprises: removing the entry that matches from the list; and providing a command to the memory device to disable the function with respect to the block.

Example 16 is a system comprising: a memory device; and a processing device, operatively coupled with the memory device, to perform operations comprising: accessing a command to read data from a page in a block of the memory device; determining the block is partially programmed; determining a last written page in the block is not the last remaining open page in the block; accessing a list comprising one or more entries, each of the one or more entries indicating enablement of a function to apply read level offsets to an open block in the memory device; determining whether the block matches an entry in the list; based on determining that the block does not match any entry on the list, enabling the function to apply the read level offsets to the block based on determining the page is the last remaining open page in the block; and adding the command to a prioritized queue of commands, the memory device to execute commands from the prioritized queue in an order based on a priority level assigned to each command.

Example 17 includes the system of example 16 wherein enabling the function comprises: adding an entry to the list that includes an identifier associated with the block; and providing a command to the memory device to enable the function with respect to the block.

Example 18 includes the system of any one of examples 16 or 17, wherein the operations further comprise: selecting a first entry in the list for replacement; wherein enabling the function comprises replacing the first entry with a second entry corresponding to the block.

Example 19 includes the system of any one of examples 16-18, wherein the operations further comprise: based on determining that the block matches an entry on the list, updating the entry on the list.

Example 20 includes the system of any one of examples 16-19, wherein the adding of the command to the prioritized queue comprises assigning a priority level to the command.

Example 21 includes the system of any one of examples 16-20, wherein assigning the priority level to the command comprises assigning a first priority level to the command, the first priority level being associated with one or more program commands included in the prioritized queue.

Example 22 is a method comprising: accessing, by a processing device, a command to read data from a page in a block of a memory device; determining, by the processing device, the block is partially programmed; determining, by the processing device, a last written page in the block is not a last remaining open page in the block; accessing, by the processing device, a list comprising one or more entries, each of the one or more entries indicating enablement of a function to apply read level offsets to an open block in the memory device; determining, by the processing device, whether the block matches an entry in the list; based on determining that the block does not match any entry on the list, enabling, by the processing device, the function to apply the read level offsets to the block based on determining the page is the last remaining open page in the block; and adding, by the processing device, the command to a prioritized queue of commands, the memory device to execute commands from the prioritized queue in an order based on a priority level assigned to each command.

Example 23 includes the method of example 22, wherein enabling the function comprises: adding an entry to the list that includes an identifier associated with the block; and providing a command to the memory device to enable the function with respect to the block.

Example 24 includes the method of examples 22 or 23, further comprising selecting a first entry in the list for replacement; wherein enabling the function comprises replacing the first entry with a second entry corresponding to the block.

Example 25 includes the method of examples 22-24, wherein the operations further comprise: based on determining that the block matches an entry on the list, updating the entry on the list.

Example 26 includes the method of examples 22-25, wherein the adding of the command to the prioritized queue comprises assigning a priority level to the command.

Example 27 includes the method of examples 22-26, wherein assigning the priority level to the command comprises assigning a first priority level to the command, the first priority level being associated with one or more program commands included in the prioritized queue.

Example 28 is a computer-readable storage medium comprising instructions that, when executed by a processing device, configure the processing device to perform operations comprising: accessing a command to read data from a page in a block of a memory device; determining the block is partially programmed; determining a last written page in the block is not the last remaining open page in the block; accessing a list comprising one or more entries, each of the one or more entries indicating enablement of a function to apply read level offsets to an open block in the memory device; determining whether the block matches an entry in the list; based on determining that the block does not match any entry on the list, enabling the function to apply the read level offsets to the block based on determining the page is a last remaining open page in the block; and adding the command to a prioritized queue of commands, the memory device to execute commands from the prioritized queue in an order based on a priority level assigned to each command.

Example 29 includes the computer-readable storage medium of example 28, wherein enabling the function comprises: adding an entry to the list that includes an identifier associated with the block; and providing a command to the memory device to enable the function with respect to the block.

Example 30 includes the computer-readable storage medium of any one or more of example 28 and 29, wherein the operations further comprise: selecting a first entry in the list for replacement; wherein enabling the function comprises replacing the first entry with a second entry corresponding to the block.

Figure 6:
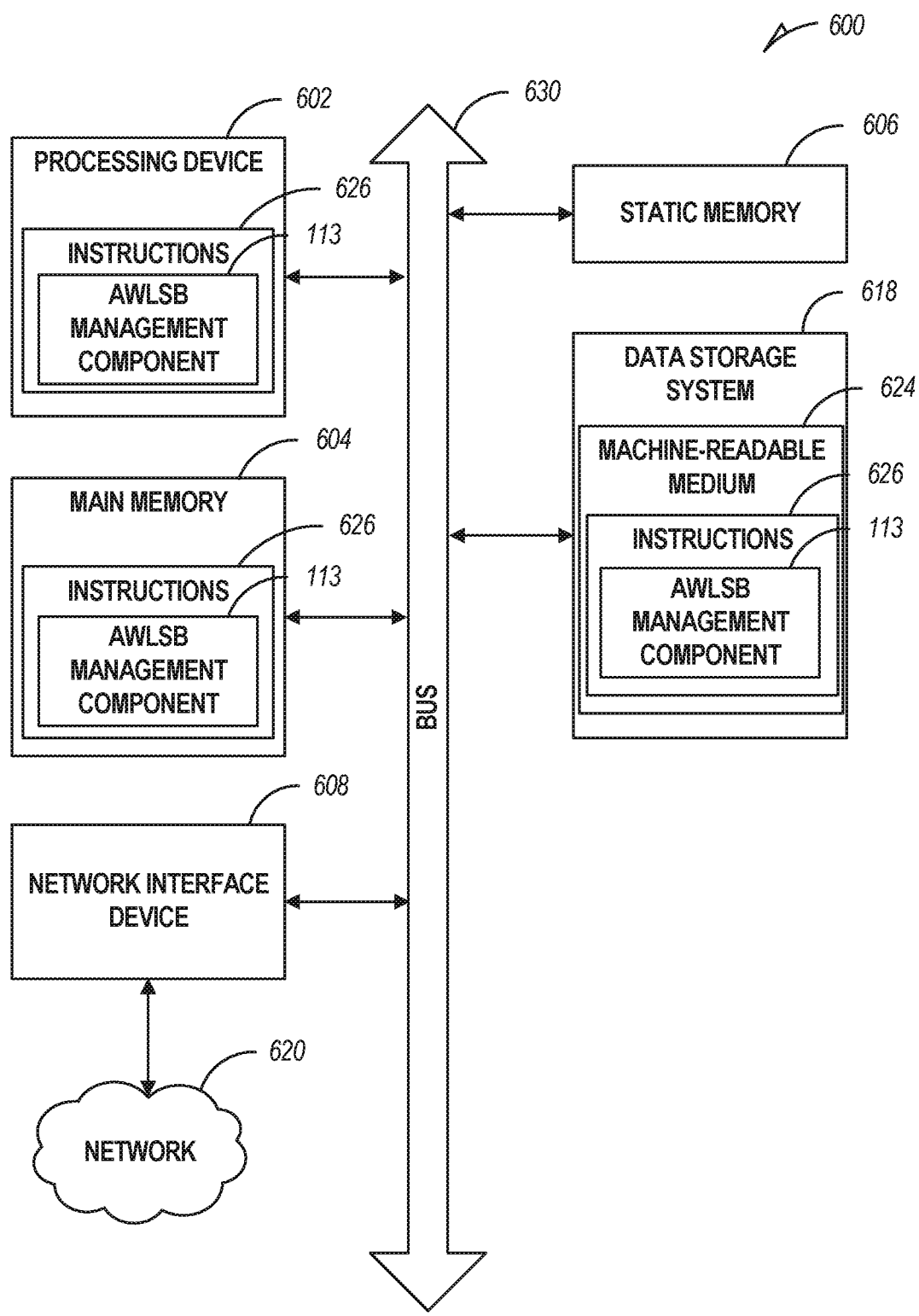
FIG. 6 is a block diagram of an example computer system in which embodiments of the present disclosure may operate.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the AWLSB management component 113 of FIG. 1). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., ROM, flash memory, DRAM such as SDRAM or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device 602 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an ASIC, a FPGA, a digital signal processor (DSP), network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a data destruction component (e.g., the AWLSB management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, and so forth.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
accessing a command associated with a page in a block of the memory device;
accessing a list comprising one or more entries, each of the one or more entries indicating enablement of a function to apply read level offsets to an open block in the memory device;
determining the list includes an entry that matches the block, the entry indicating enablement of the function to apply read level offsets to the block;
disabling the function to apply the read level offsets to the block; and
adding the command to a prioritized queue of commands, the memory device to execute commands from the prioritized queue in an order based on a priority level assigned to each command.

2. The system of claim 1, wherein the operations further comprise:
removing the block from a last written page list based on completion of a program operation executed in response to the command, the last written page list identifying a most recently programmed page in each open block of the memory device.

3. The system of claim 1, wherein the adding of the command to the prioritized queue comprises assigning a priority level to the command.

4. The system of claim 3, wherein assigning the priority level to the command comprises assigning a first priority level to the command, the first priority level being associated with one or more program commands included in the prioritized queue.

5. The system of claim 1, wherein disabling the function comprises:
removing the entry that matches from the list; and
providing a command to the memory device to disable the function with respect to the block.

6. A method comprising:
accessing, by a processing device, a command associated with a page in a block of a memory device;
accessing, by the processing device, a list comprising one or more entries, each of the one or more entries indicating enablement of a function to apply read level offsets to an open block in the memory device;
determining, by the processing device, the list includes an entry that matches the block, the entry indicating enablement of the function to apply read level offsets to the block;
disabling, by the processing device, the function to apply the read level offsets to the block; and
adding, by the processing device, the command to a prioritized queue of commands, the memory device to execute commands from the prioritized queue in an order based on a priority level assigned to each command.

7. The method of claim 6, further comprising:
removing the block from a last written page list based on completion of a program operation executed in response to the command, the last written page list identifying a most recently programmed page in each open block of the memory device.

8. The method of claim 6, wherein the adding of the command to the prioritized queue comprises assigning a priority level to the command.

9. The method of claim 8, wherein assigning the priority level to the command comprises assigning a first priority level to the command, the first priority level being associated with one or more program commands included in the prioritized queue.

10. The method of claim 6, wherein disabling the function comprises:
removing the entry that matches from the list; and
providing a command to the memory device to disable the function with respect to the block.

11. A non-transitory computer-readable storage medium comprising instructions that, when executed by a processing device, configure the processing device to perform operations comprising:
access a command associated with a page in a block of a memory device;
accessing a list comprising one or more entries, each of the one or more entries indicating enablement of a function to apply read level offsets to an open block in the memory device;
determining the list includes an entry that to the block, the entry indicating enablement of the function to apply read level offsets to the block;
disabling the function to apply the read level offsets to the block; and
adding the command to a prioritized queue of commands, the memory device to execute commands from the prioritized queue in an order based on a priority level assigned to each command.

12. The non-transitory computer-readable storage medium of claim 11, further comprising:
removing the block from a last written page list based on completion of a program operation executed in response to the command, the last written page list identifying a most recently programmed page in each open block of the memory device.

13. The non-transitory computer-readable storage medium of claim 11, wherein the adding of the command to the prioritized queue comprises assigning a priority level to the command.

14. A system comprising:
a memory device; and
a processing device, operatively coupled with the memory device, to perform operations comprising:
accessing a command associated with a page in a block of the memory device;

accessing a list comprising one or more entries, each of the one or more entries indicating enablement of a function to apply read level offsets to an open block in the memory device;

determining whether the block matches an entry in the list;

based on determining that the block does not match any entry on the list, enabling the function to apply the read level offsets to the block; and adding the command to a prioritized queue of commands, the memory device to execute commands from the prioritized queue in an order based on a priority level assigned to each command.

15. The system of claim 14, wherein enabling the function comprises:

adding an entry to the list that includes an identifier associated with the block; and providing a command to the memory device to enable the function with respect to the block.

16. The system of claim 14, wherein the operations further comprise:

selecting a first entry in the list for replacement;

wherein enabling the function comprises replacing the first entry with a second entry corresponding to the block.

17. The system of claim 14, wherein the operations further comprise:

based on determining that the block matches an entry on the list, updating the entry on the list.

18. The system of claim 14, wherein the adding of the command to the prioritized queue comprises assigning a priority level to the command.

19. A method comprising:

accessing, by a processing device, a command to read data from a page in a block of a memory device;

accessing, by the processing device, a list comprising one or more entries, each of the one or more entries indicating enablement of a function to apply read level offsets to an open block in the memory device;

determining, by the processing device, whether the block matches an entry in the list;

based on determining that the block does not match any entry on the list, enabling, by the processing device, the function to apply the read level offsets to the block; and adding, by the processing device, the command to a prioritized queue of commands, the memory device to execute commands from the prioritized queue in an order based on a priority level assigned to each command.

20. A non-transitory computer-readable storage medium comprising instructions that, when executed by a processing device, configure the processing device to perform operations comprising:

accessing a command to read data from a page in a block of a memory device;

accessing a list comprising one or more entries, each of the one or more entries indicating enablement of a function to apply read level offsets to an open block in the memory device;

determining whether the block matches an entry in the list;

based on determining that the block does not match any entry on the list, enabling the function to apply the read level offsets to the block; and adding the command to a prioritized queue of commands, the memory device to execute commands from the prioritized queue in an order based on a priority level assigned to each command.

* * * * *